US012795220B2

(12) United States Patent
Yoshida

(10) Patent No.: US 12,795,220 B2
(45) Date of Patent: Nov. 10, 2026

(54) IMAGE CAPTURING APPARATUS INCLUDING IMAGE BLUR CORRECTION MECHANISM AND HAVING HEAT DISSIPATION FUNCTION

(71) Applicant: CANON KABUSHIKI KAISHA, Tokyo (JP)

(72) Inventor: Takashi Yoshida, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 19/207,785

(22) Filed: May 14, 2025

(65) Prior Publication Data

US 2025/0365489 A1 Nov. 27, 2025

(30) Foreign Application Priority Data

May 22, 2024 (JP) ................................ 2024-083269

(51) Int. Cl.

*H04N 23/52* (2023.01)
*H04N 23/54* (2023.01)
*H05K 7/20* (2006.01)

(52) U.S. Cl.

CPC ............ *H04N 23/52* (2023.01); *H04N 23/54* (2023.01); *H05K 7/2039* (2013.01)

(58) Field of Classification Search

CPC ....... H04N 23/52; H04N 23/54; H05K 7/2039
USPC ........................................................ 348/374
See application file for complete search history.

(56) References Cited

U.S. PATENT DOCUMENTS

| | | | | | |
|---|---|---|---|---|---|
| 9,386,200 | B2 * | 7/2016 | Hongo | H04N 23/54 | |
| 12,149,807 | B2 * | 11/2024 | Katsumata | H04N 23/52 | |
| 12,495,192 | B2 * | 12/2025 | Shibazaki | H04N 23/52 | |
| 12,513,379 | B2 * | 12/2025 | Momose | H04N 23/50 | |
| 12,563,298 | B2 * | 2/2026 | Abe | H04N 23/52 | |
| 2014/0055670 | A1 * | 2/2014 | Hongo | H04N 23/54 | 348/374 |
| 2019/0163036 | A1 * | 5/2019 | Kamada | H05K 7/2039 | |
| 2023/0232088 | A1 * | 7/2023 | Katsumata | H04N 23/52 | 348/208.7 |
| 2023/0328346 | A1 * | 10/2023 | Shibazaki | H04N 23/52 | 348/374 |
| 2024/0251166 | A1 * | 7/2024 | Yoshida | H04N 23/52 | |
| 2024/0323532 | A1 * | 9/2024 | Abe | H04N 23/52 | |
| 2024/0397175 | A1 * | 11/2024 | Momose | H04N 23/50 | |

FOREIGN PATENT DOCUMENTS

| | | | |
|---|---|---|---|
| JP | 2012028940 | A | 2/2012 |
| WO | 2020202811 | A1 | 10/2020 |

* cited by examiner

*Primary Examiner* — Pritham D Prabhakher

(74) *Attorney, Agent, or Firm* — Cowan, Liebowitz & Latman, P.C.

(57) ABSTRACT

An image capturing apparatus includes a movable part that holds an image sensor and a fixed part that fixes the movable part in a state movable in a direction perpendicular to an optical axis direction. A heat dissipation member connects between the movable part and the fixed part. A movable-side holding plate is held integrally with the heat dissipation member. A fixed-side holding plate which is different from the first holding plate is held integrally with the heat dissipation member. The movable-side holding plate is fixed to the movable part, and the fixed-side holding plate is fixed to the fixed part. Fixing of the movable-side holding plate and the fixed-side holding plate is performed in the optical axis direction.

10 Claims, 10 Drawing Sheets

IMAGE CAPTURING APPARATUS INCLUDING IMAGE BLUR CORRECTION MECHANISM AND HAVING HEAT DISSIPATION FUNCTION

BACKGROUND

Field of the Technology

The present disclosure relates to an image capturing apparatus including an image blur correction mechanism and having a heat dissipation function.

Description of the Related Art

An image capturing apparatus, such as a digital still camera and a video camera, includes an image sensor, such as a complementary metal-oxide semiconductor (CMOS) sensor or a charge coupled device (CCD) sensor, for capturing an object image, and electronic devices, such as a central processing unit (CPU) and an integrated circuit (IC), which are mounted on a circuit substrate, and these components generate heat. If the image sensor and the electronic components excessively rise in temperature, these components are lowered in performance or suffer a malfunction, which can prevent proper image capturing. Further, in recent years, for improvement of image quality, an image capturing apparatus has come into widespread use which performs "image blur correction" by moving the image sensor in a direction orthogonal to an optical axis direction.

In such an image capturing apparatus that performs image blur correction as well, heat generated in the image sensor when the image blur correction mechanism is driven, or when continuous shooting is performed, or when moving image shooting is performed, affects image quality, and therefore, it is also necessary to ensure sufficient heat dissipation property. PCT International Patent Publication No. WO2020/202811 discloses an apparatus that reduces load applied to the image blur correction mechanism, by arranging a bendable heat dissipation member that connects between a movable part and a fixed part of the image blur correction mechanism such that the thickness of the bendable heat dissipation member is orthogonal to the optical axis direction. Further, Japanese Laid-Open Patent Publication (Kokai) No. 2012-28940 discloses an image capturing apparatus that dissipates heat by connecting a heat dissipation member to a sheet metal of the bottom of the apparatus.

However, in the related art disclosed in PCT International Patent Publication No. WO2020/202811, a position where the heat dissipation member is fixed is not disclosed, and hence there is a problem that in a case where a repulsion force of the heat dissipation member and the fixing direction of the heat dissipation member are different, it is difficult to fix the heat dissipation member when the apparatus is assembled. Further, in the related art disclosed in Japanese Laid-Open Patent Publication (Kokai) No. 2012-28940, the heat dissipation member is thermally connected to a reverse side of the image sensor with a small bending radius, and hence there is a problem that in a case where the heat dissipation member is applied to the image blur correction mechanism, the control load is increased.

SUMMARY

The present disclosure provides an image capturing apparatus that is easy to assemble without impairing controllability of driving of a movable part while being capable of sufficiently cooling heat from an image sensor.

In the present disclosure, there is provided an image capturing apparatus including a movable part that holds an image sensor, and a fixed part that fixes the movable part in a state movable in a direction perpendicular to an optical axis direction, including a heat dissipation member that connects between the movable part and the fixed part, a first holding plate that is held integrally with the heat dissipation member, and a second holding plate that is held integrally with the heat dissipation member and is different from the first holding plate, wherein the first holding plate is fixed to the movable part, and the second holding plate is fixed to the fixed part, and wherein fixing of the first holding plate and the second holding plate is performed in the optical axis direction.

According to the present disclosure, it is possible to provide the image capturing apparatus that is easy to assemble without impairing controllability of driving of the movable part while being capable of sufficiently cooling heat from the image sensor.

Features of the present disclosure will become apparent from the following description of embodiments with reference to the attached drawings. The following description of embodiments are described by way of example.

DESCRIPTION OF THE EMBODIMENTS

The present disclosure will now be described in detail below with reference to the accompanying drawings showing embodiments thereof. The configurations described in the following embodiments are given only by way of example, and are by no means intended to limit the scope of the present invention. Note that in the following embodiments, a digital camera 100 will be described as an example of an image capturing apparatus, but the image capturing apparatus is not limited to this.

Figure 1:
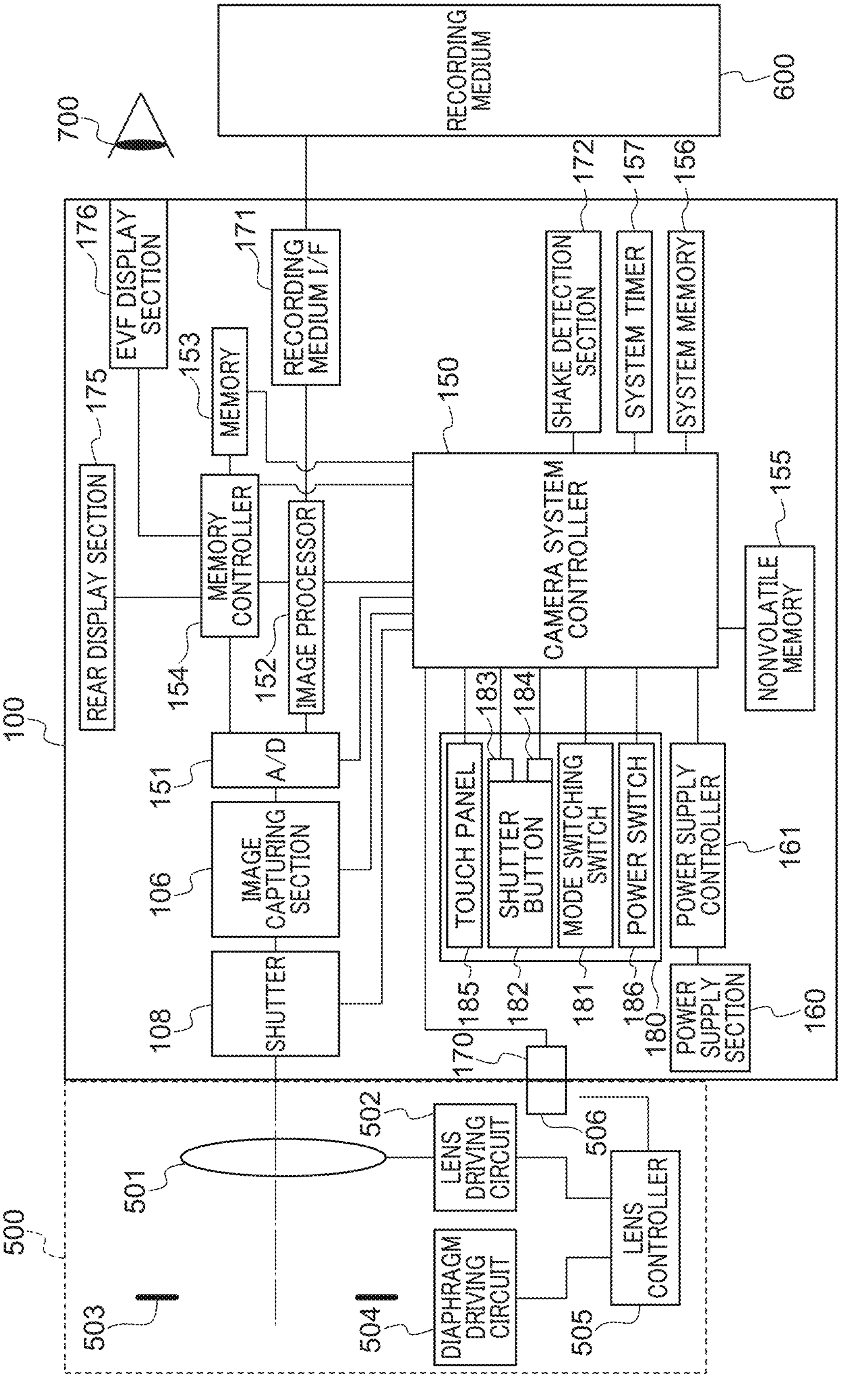
FIG. 1 FIG. 1 is a block diagram of a digital camera.

FIG. 1 shows the configuration of the digital camera (hereinafter also referred to as the "camera") 100 as one aspect of an image capturing apparatus according to a first embodiment of the present disclosure. To the camera 100, a lens unit 500 having a lens 501 is removably (interchangeably) attached. Although FIG. 1 shows only one lens 501 for simplification, a plurality of lenses can be provided. The lens unit 500 includes a diaphragm 503, a diaphragm driving circuit 504 for driving the diaphragm 503, a lens driving circuit 502 for driving the lens 501, a lens controller 505, and a lens communication terminal 506.

The lens communication terminal 506 is a communication terminal used by the lens unit 500 to communicate with the digital camera 100. The lens controller 505 having received a control instruction from a camera system controller 150 by communication performs position (aperture value) control of the diaphragm 503 and focus control of the lens 501 via the diaphragm driving circuit 504 and the lens driving circuit 502, respectively.

On a downstream side of the lens unit 500, a shutter 108, an image capturing section 106, and an analog-to-digital (A/D) converter 151 are arranged. The shutter 108 is e.g. a focal plane shutter that controls exposure time of an image sensor 115, described hereinafter, and its operation is controlled by the camera system controller 150, described hereinafter. The image sensor 115 is implemented e.g. by a CCD sensor or a CMOS sensor, photoelectrically converts (captures) an object image (optical image) formed by light incident through the lens 501, and outputs image capturing signals (analog signals). The image sensor 115, not shown in FIG. 1, is incorporated in the image capturing section 106. The A/D converter 151 converts the analog image capturing signals output from the image sensor 115 from analog to digital to generate digital captured image signals.

The digital captured image signals are stored in a memory 153 via an image processor 152 and a memory controller 154 or via the memory controller 154. The memory controller 154 controls transfer of data between the A/D converter 151, the image processor 152, the camera system controller 150, and the memory 153. The memory 153 temporarily stores the digital captured image signals output from the A/D converter 151 and image data generated by the image processor 152. The image processor 152 performs image processing, such as pixel interpolation processing, resizing, and color conversion processing, on the digital captured image signals from the A/D converter 151 and the memory controller 152 to generate image data. Further, the image processor 152 executes automatic white balance processing and the like, based on a result of calculation using the image data.

The camera system controller 150 is implemented by a computer including a processor, such as a CPU, and a circuit, and controls the camera 100 and the lens unit 500 by executing programs stored in a nonvolatile memory 155. For example, the camera system controller 150 controls the image sensor 115 and the shutter 108 according to an image capturing instruction provided by a user, and further performs auto-focus control and aperture control based on the image data generated by the image processor 152. The nonvolatile memory 155 is an electrically erasable and recordable read-only memory device and stores constants for the operation of the camera system controller 150, programs, and so forth. The camera system controller 150 executes the programs stored in the nonvolatile memory 155, whereby a variety of functions necessary for the operation of the camera 100 are realized.

A plurality of types of electronic devices are connected to the camera system controller 150. For example, a shake detection section 172, a system timer 157, and a system memory 156 are connected. The system memory 156 is a readable and writable memory device that stores constants and variables for the operation of the camera system controller 150, a program loaded from the nonvolatile memory 155, and so forth. The system timer 157 measures a non-operation time period before performing automatic power-off for shifting the camera 100 to a power-saving state to prevent wasteful consumption of a battery in a case where the camera 100 is not operated by a user, and an exposure time period of the image sensor 115 using the shutter 108. The shake detection section 172 is implemented e.g. by a gyro sensor and outputs a signal corresponding to a shake of the camera 100 (hereinafter also referred to as the "camera shake"), which is caused e.g. by a hand shake.

A power supply section 160 is formed by a primary battery, a secondary battery, or an AC adapter. A power supply controller 161 detects whether or not a battery is attached to the power supply section 160, a type of an attached battery, and a remaining amount of the battery, and supplies required amounts of volage to supply destinations at required timings. Further, a lens communication terminal 170 is electrically connected to the lens communication terminal 506 provided in the lens unit 500 and performs communication between the camera system controller 150 and the lens controller 505 in the lens unit 500.

A recording medium I/F 171 is an interface with a recording medium 600 which is removably attached to the camera 100. The recording medium 600 is a memory card, a flash memory, a USB memory, a hard disk, or the like, and records image data (data of still images and moving images) generated by the image processor 152.

A plurality of electronic devices, such as a CPU, ICs, and memory chips, which form the above-described A/D converter 151, image processor 152, camera system controller 150, memory 153, memory controller 154, and so forth are mounted on a main board 107, described hereinafter. Similarly, a plurality of electronic devices, such as a CPU, ICs, and memory chips, which form the above-described nonvolatile memory 155, system memory 156, system timer 157, power supply controller 161, and so forth are mounted on the main board 107. Further, the recording medium I/F 171 and the shake detection section 172 are also mounted on the main board 107.

The above-described memory 153 also functions as a memory for image display (video memory). The digital captured image signals and the image data, which are written in the memory 153, are displayed on a rear display section 175 provided on a rear surface of the camera 100 and an EVF display section 176 arranged in a viewfinder, via the memory controller 154, as a live view image or an image for checking a captured image. The rear display section 175 and the EVF display section 176 are each implemented by a display device, such as a liquid crystal panel or an organic EL panel.

An operation section 180 is an input section for receiving an operation performed by a user and outputs a signal corresponding to a received operation to the camera system controller 150. The operation section 180 is comprised of a variety of operation members, such as a mode switching switch 181, a first shutter switch 183 and a second shutter switch 184, which are interlocked with a shutter button 182, a touch panel 185, and a power switch 186.

The mode switching switch 181 is an operation member for switching between shooting modes, such as a still image shooting mode and a moving image shooting mode. The shutter button 182 is an operation member used by a user to give a shooting preparation instruction and a shooting instruction. The first shutter switch 183 is turned "ON" when the shutter button 182 is half-pressed and outputs a "SW1 signal" to the camera system controller 150. Further, the second shutter switch 184 is turned "ON" when the shutter button 182 is fully pressed and outputs a "SW2 signal" to the camera system controller 150. The camera system controller 150 executes the shooting preparation operation (such as autofocus, auto exposure, and auto white balance) upon receipt of the "SW1 signal", and executes processing for shooting a still image for recording, upon receipt of the "SW2 signal".

The operation section 180 also includes the touch panel 185 provided on the rear display section 175. The power switch 186 is a switch operated to switch ON/OFF of the power of the camera 100. Note that reference numeral 700 denotes an eye 700 of a user observing the EVF display section 176.

Figure 2:
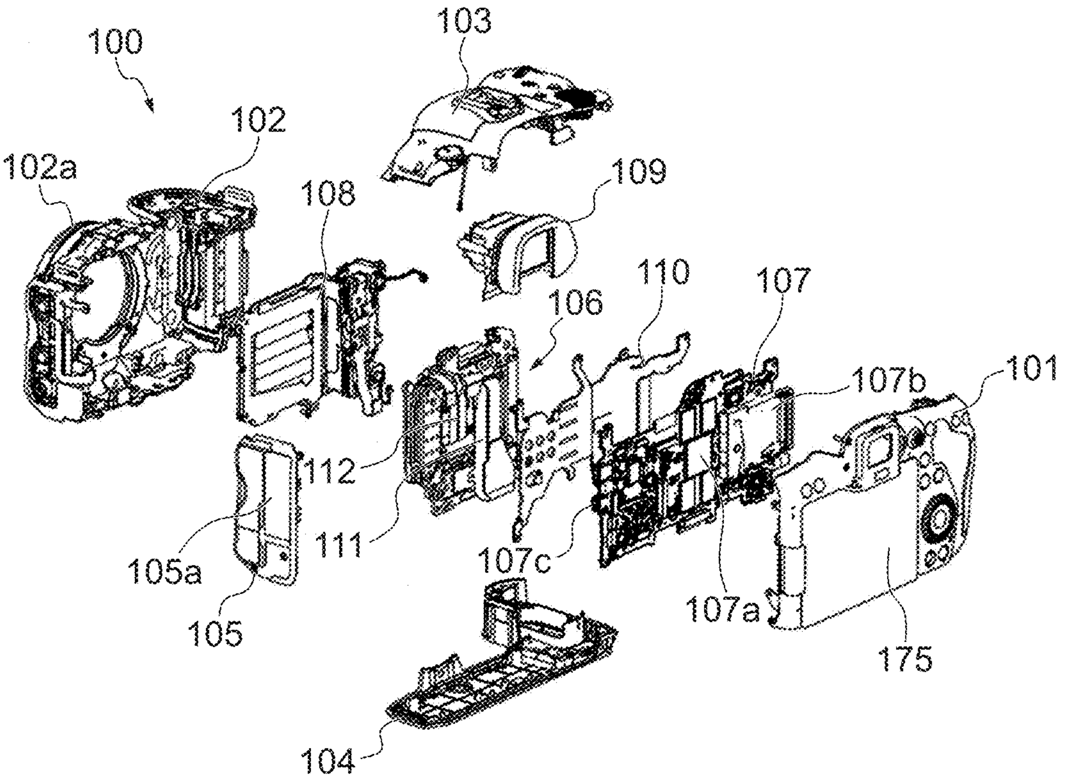
FIG. 2 is an exploded perspective view of the digital camera.

FIG. 2 is an exploded perspective view of the camera 100, as viewed obliquely from the rear. The digital camera 100 has a front base 102, a rear cover 101, a top cover 103, a bottom cover 104, and a side cover 105, as the exterior members. These exterior members form the surface part of the appearance of the camera 100.

The front base 102 is formed of magnesium die cast and resin, and has a mount 102*a* fixed thereto to which the lens unit 500 is attached, and a grip part (not shown) used by a user to grip the camera 100. On the rear cover 101, there are mounted a plurality of operation members which can be operated by a user and the rear display section 175 which can be opened and closed. Further mounted on the rear cover 101 are the EVF display section 176 and a finder unit 109 (see a central upper location in FIG. 2) to which a user observing the EVF display section 176 brings the eye 700 close, as illustrated in FIG. 1.

On the top cover 103, there are mounted a plurality of operation members (the mode switching switch 181, the shutter button 182, the power switch 186, and so forth, appearing in FIG. 1) which can be operated by a user. The bottom cover 104 is formed with a battery cover which covers an opening of a battery chamber for accommodating a battery, an opening for exposing a tripod mount which can be connected to the bottom portion of the front base 102, and so forth. Attached to the side cover 105 is a terminal cover 105*a* for protecting an external communication terminal 107*c*, described hereinafter.

Inside these exterior members, the shutter 108, the image capturing section 106 including the image sensor 115 and the image blur correction mechanism, the chassis 110, and the main board 107 are arranged in the mentioned order from the object side. The image capturing section 106 has a movable part 114 which can move the image sensor 115 in two directions (a yaw direction and a pitch direction) which are orthogonal to a photographing optical axis (optical axis direction) and also orthogonal to each other, and a fixed part (holding part) 113 which holds the movable part 114 in a state movable in the above-mentioned two directions (see FIG. 3A). That is, the movable part 114 is movable within a plane orthogonal to the optical axis direction. Note that the fixed part 113 and the movable part 114 will be described hereinafter, and hence they are not shown in FIG. 2.

Further, the image capturing section 106 is provided with an image capturing signal flexible printed circuit (FPC) 111 and an image capturing power supply FPC 112. The image capturing signal FPC 111 has wiring for transmitting an image capturing signal output from the image sensor 115 and a control signal necessary for driving the image sensor 115, and these signals are sent to the camera system controller 150 mounted on the main board 107. Further, the image capturing power supply FPC 112 has wiring for supplying power for driving the image sensor 115 from the power supply controller 161 to the image sensor 115.

The main board 107 is formed by a multilayer board and has a variety of electronic components mounted on both sides thereof, which include the above-mentioned plurality of electronic devices. The main board 107 is fixed to the front base 102 and the chassis 110 made of metal, with e.g. screws. Further, on the main board 107, there are mounted a control IC 107*a* for controlling the image capturing signal and the like, a recording medium connector 107*b* for accommodating an external recording medium, and the external communication terminal 107*c* for connecting a cable used to connect to an external apparatus.

Out of the components of the camera 100, the image sensor 115 is particularly large in power consumption, generates a large amount of heat, and easily becomes high in temperature. Time over which image capturing can be performed in the camera 100 is limited by the operation-guaranteed temperature of the image sensor 115, besides the remaining amount of the battery. To keep the time over which image capturing can be performed, as long as possible, it is necessary to cool the image sensor 115 and prevent its temperature from exceeding the operation-guaranteed temperature. For this reason, the image capturing section 106 is fixed to the front base 102 with screws, and heat of the image capturing section 106 is transferred to the front base 102 to cool the image capturing section 106.

Figure 3A:
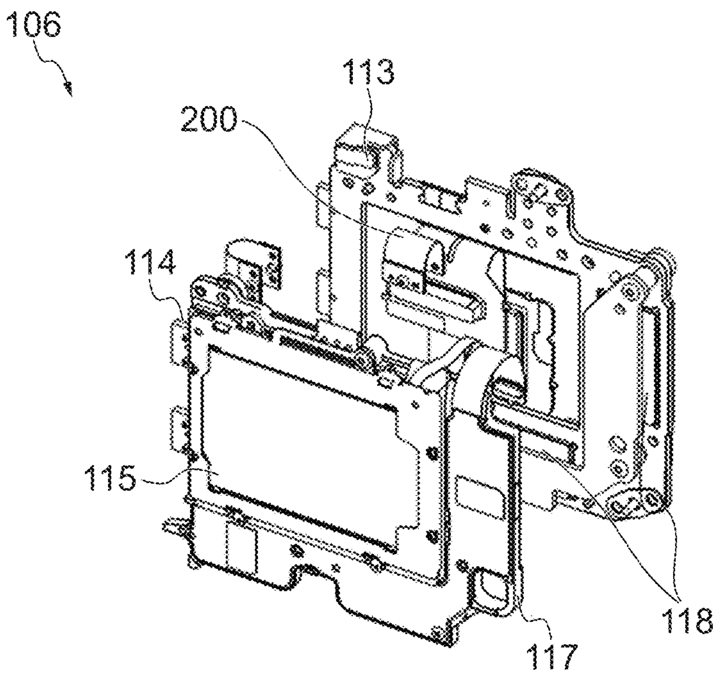
FIGS. 3A and 3B are exploded perspective views of an image capturing section.
Figure 3B:
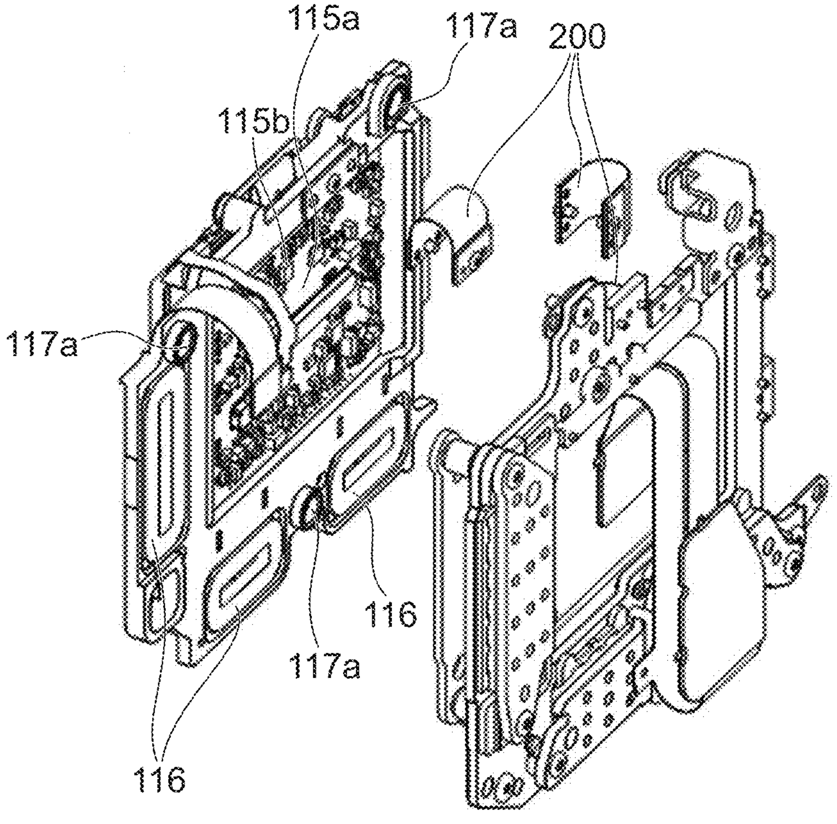

FIGS. 3A and 3B are exploded perspective views of the image capturing section 106, as viewed obliquely from the front and the rear, respectively. The image capturing section 106 includes the fixed part 113 and the movable part 114. The movable part 114 is comprised of the image sensor 115 and a sensor holder 117 holding the image sensor 115. Specifically, the image sensor 115 is fixed to the central portion of the sensor holder 117 with adhesive.

The image sensor 115 is formed by fixing a sensor chip having a plurality of pixels to an imaging board 115*a* with adhesive, and electrically connecting electrodes of the sensor chip and an imaging circuit on the imaging board 115*a* by wire bonding. On a reverse side (rear side) of the imaging board 115*a*, opposite from the surface to which the sensor chip is bonded, there are mounted sensor electronic devices 115*b*, such as a capacitor, a resistor, and a regulator, which form the imaging circuit. Three heat dissipation members 200, described hereinafter, are arranged such that they connect between the movable part 114 and the fixed part 113 in the optical axis direction. Further, each heat dissipation member 200 has flexibility to improve the driving controllability of the movable part 114.

The sensor holder 117 is held by the fixed part 113 in a state movable in two directions (a horizontal direction and a vertical direction) which are orthogonal to the photographing optical axis (optical axis direction) and are orthogonal to each other. Three coils 116 are fixed to the sensor holder 117. The fixed part 113 includes three magnets 118 at respective locations opposed to the three coils 116. The movable part 114 is attracted toward the rear in the photographing optical axis direction, by the magnet force of the magnets 118. Balls, not shown, held in ball holding portions 117*a* formed in a plurality of locations on the sensor holder 117 are arranged between the movable part 114 and the fixed part 113. With this, the movable part 114 is positioned in the photographing optical axis direction with respect to the fixed part 113 via the balls.

The image capturing section 106 configured as described above can move the image sensor 115 in the above-mentioned two directions by controlling energization of the three coils 116. The camera system controller 150 controls energization of the coils 116 such that the movable part 114 is moved in a direction of correcting (reducing) an image blur caused by camera shake according to camera shake detected by the shake detection section 172 (hereinafter also referred to as the "driving control"). That is, the camera 100 is equipped with the "image blur correction mechanism". Further, electrical connection between the image capturing section 106 and the main board 107 is performed by using FPCs.

The heat dissipation members 200 are arranged such that they connect between the movable part 114 and the fixed part 113, and are each formed e.g. by a graphite sheet laminated e.g. by a polyethylene terephthalate (PET) film. Heat generated in the image sensor 115 is transferred to the fixed part 113 via the movable part 114 holding the image sensor 115 and the heat dissipation members 200. Then, the heat is transferred from the fixed part 113 to the front base 102 which is fixed with screws or the like, whereby the heat generated in the image sensor 115 is dissipated.

Figure 4A:
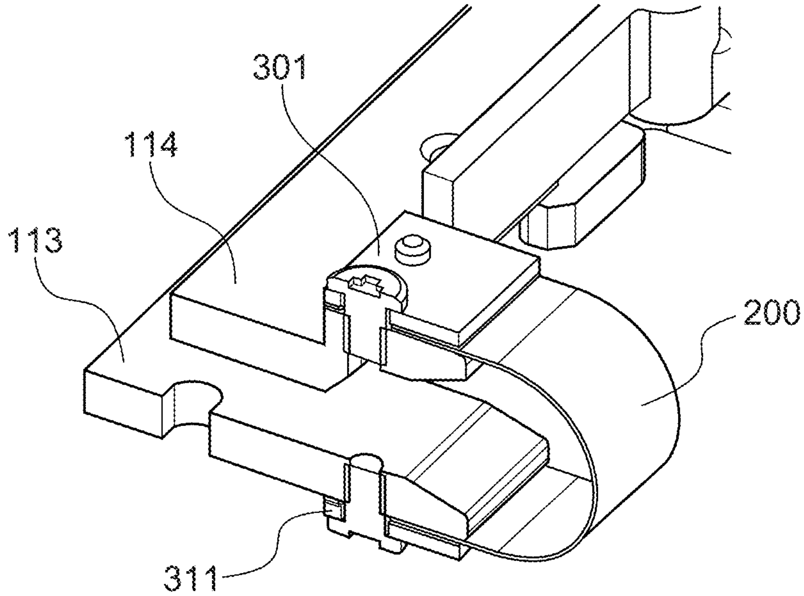
FIGS. 4A and 4B are a cross-sectional perspective view and a cross-sectional view of essential parts of the digital camera, respectively.
Figure 4B:
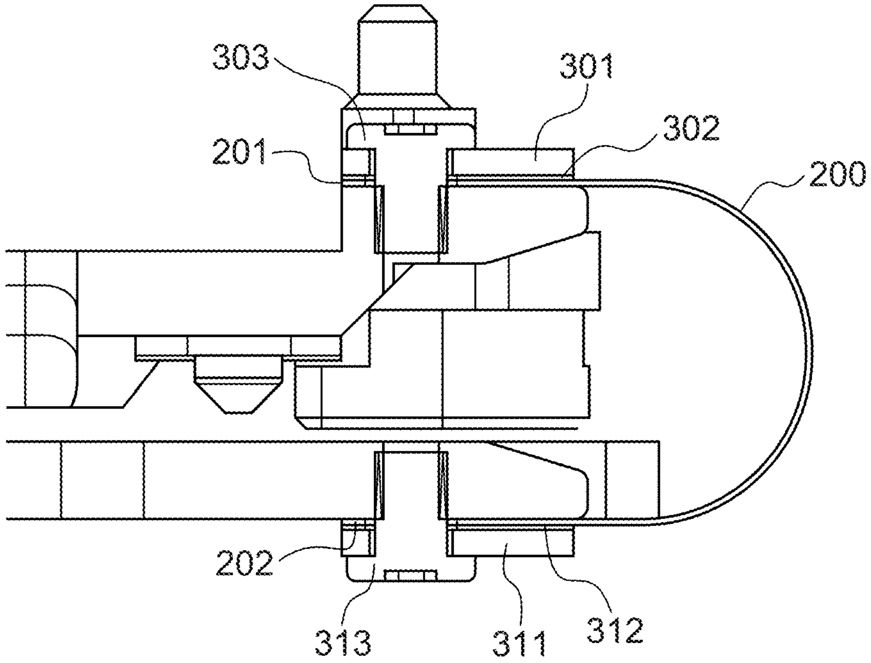

Next, a heat dissipation configuration which can be easily assembled while preventing the driving controllability of the movable part 114 from being impaired by the heat dissipation members 200 will be described with reference to FIGS. 4A and 4B. FIGS. 4A and 4B show a state in which one of the heat dissipation members 200 is fixed to the fixed part 113 and the movable part 114. FIG. 4A is a perspective cross-sectional view, and FIG. 4B is a cross-sectional view. The heat dissipation member 200 is fixed to the movable part 114 by a movable-side holding unit 300 (see FIGS. 5A and 5B) and is fixed to the fixed part 113 by a fixed-side holding unit 310 (see FIGS. 5A and 5B).

The heat dissipation member 200 has a movable-side contact portion 201 and a fixed-side contact portion 202. The heat dissipation member 200 is brought into direct contact with the movable part 114 by the movable-side contact portion 201, and further, brought into direct contact with the fixed part 113 by the fixed-side contact portion 202. Further, the movable-side holding unit 300 (see FIGS. 5A and 5B) is formed by a movable-side holding plate 301, a movable-side adhering member 302, and a movable-side fixing member 303.

The movable-side holding plate 301 is a plate-like member which is higher in rigidity than the heat dissipation member 200. The movable-side adhering member 302 relatively fixes the heat dissipation member 200 and the movable-side holding plate 301. That is, with this relative fixing, the movable part 114 is movable with respect to the fixed part 113, and the fixed part 113 does not block or hamper the movement of the movable part 114. To express a state in which the movable part 114 is not in a state in which it is fixed (in which the movable part 114 does not move), as viewed from the fixed part 113, the state is not simply described by "fixing", but by "relative fixing" (the same concept is applied to "relative fixing" mentioned hereafter). With this, when fixing the heat dissipation member 200 to the movable part 114, it is possible to hold the movable-side holding plate 301 which is higher in rigidity than the heat dissipation member 200. During assembly work, a repulsive force of the heat dissipation member 200, an attractive force of the magnets 118, an unexpected force from the outside, or the like is sometimes applied, but since the holding part has high rigidity, it is possible to suppress deformation of the movable-side contact portion 201, and the assembly workability is improved.

Note that it is preferable, from the point of view of the image blur correction control, that the material of the movable-side holding plate 301 is a material which has not been magnetized and is excellent in thermal conductivity. In the present embodiment, aluminum having a thickness of approximately 0.5 (mm) is used. However, in a case where the heat dissipation performance of the heat dissipation member 200 is sufficient for the amount of heat generated by the image sensor 115, resin, such as polycarbonate, can be used as the material of the movable-side holding plate 301 from the point of view of weight reduction. The movable-side fixing member 303 is a member for fixing the heat dissipation member 200 and the movable-side holding unit 300 to the movable part 114. Although in the present embodiment, the movable-side fixing member 303 is fixed with a screw, it is only required to relatively fasten the dissipation member 200 and the movable part 114, and, for example, fixing can be achieved e.g. by heat caulking, with UV cure adhesive, or the like.

Figure 5A:
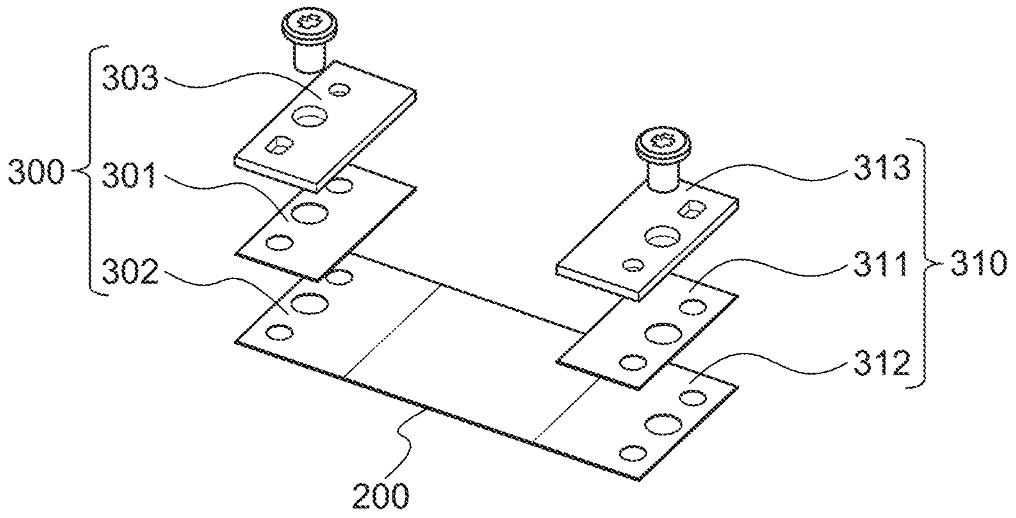
FIGS. 5A and 5B are exploded perspective views of essential parts of the digital camera.
Figure 5B:
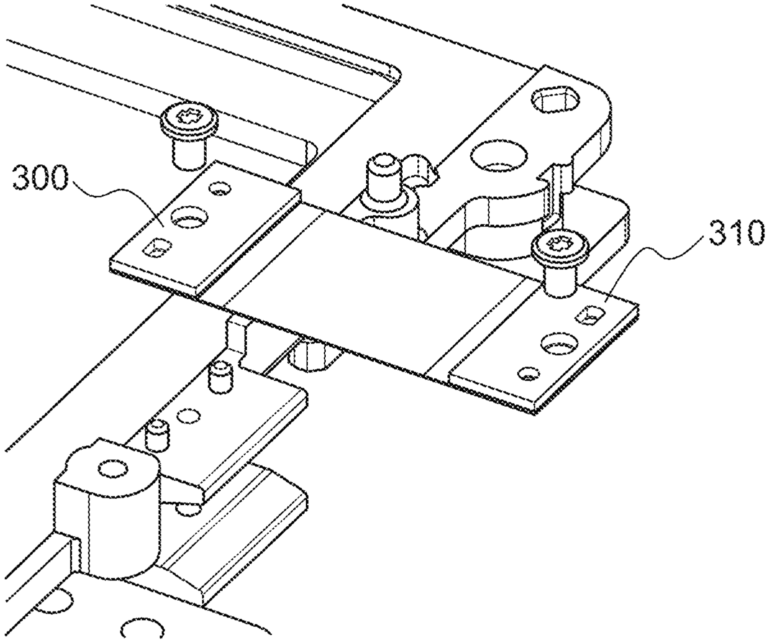

As shown in FIGS. 5A and 5B, the fixed-side holding unit 310 has a fixed-side holding plate 311, a fixed-side adhering member 312, and a fixed-side fixing member 313. Similar to the movable-side holding plate 301, the fixed-side holding plate 311 is a plate-like member which is higher in rigidity than the heat dissipation member 200. The fixed-side adhering member 312 relatively fixes the heat dissipation member 200 and the fixed-side holding plate 311. With this, when fixing the heat dissipation member 200 to the fixed part 113, it is possible to hold the fixed-side holding plate 311 which is higher in rigidity than the heat dissipation member 200. As a result, similar to the movable side, it is possible to prevent unintended deformation of the fixed-side contact portion 202 during assembly work, and the assembly workability is improved.

Note that, similar to the movable-side holding plate 301, the fixed-side holding plate 311 can be made of a material which has not been magnetized from the point of view of the image blur correction control and is excellent in thermal conductivity. In the present embodiment, aluminum having a thickness of approximately 0.5 (mm) is used. The fixed-side fixing member 313 is a member for fixing the heat dissipation member 200 and the fixed-side holding unit 310 to the fixed part 113. Although in the present embodiment, similar to the movable-side fixing member 303, the fixed-side fixing member 313 is fixed with a screw, it is only required to sufficiently fasten the dissipation member 200 and the fixed part 113, and, for example, fixing can be achieved e.g. by heat caulking, with UV cure adhesive, or the like.

In the present embodiment, heat generated in the image sensor 115 is transferred to the movable part 114, spread from the movable-side contact portion 201 to the heat dissipation member 200, and diffused and dissipated from the fixed-side contact portion 202 to the whole digital camera 100 via the fixed part 113. In the configuration of the movable part 114 and the heat dissipation member 200, there is no member interposed between the two members, and hence it is possible to more efficiently dissipate heat than in a case where another component is interposed, and it is possible to obtain the assembly workability, the heat dissipation property, and the controllability, at the same time. The same is applied to the configuration of the fixed part 113 and the heat dissipation member 200.

Although one heat dissipation member 200 has been described with reference to FIGS. 4A and 4B, in the present embodiment, three heat dissipation members 200 are arranged as shown in FIGS. 3A and 3B, and the other two have the same configuration. Further, the movable-side fixing member 303 is mounted from a light receiving surface side of the of the image sensor 115, and the fixed-side fixing member 313 is mounted from a side opposite to the light receiving surface side.

Next, the assembling configuration of the heat dissipation member 200, the movable-side holding unit 300 and the fixed-side holding unit 310 will be described with reference to FIGS. 5A and 5B. FIG. 5A is an exploded perspective view showing a state of assembling the heat dissipation member 200 and the holding units, and FIG. 5B is an exploded perspective view showing a state of assembling the movable part 114, the fixed part 113, and the heat dissipation member 200.

The movable-side holding plate 301 and the movable-side adhering member 302 are each formed with three through holes. The number of the through holes can be four or more. The penetrating direction of the three through holes, appearing in FIGS. 5A and 5B, is perpendicular to the movable direction of the movable part 114. When assembling, the screw inserted through the movable-side fixing member 303 and two positioning shapes (protrusions) formed on the movable part 114 are inserted and disposed in the through holes, respectively, whereby the movable-side holding unit 300 and the movable part 114 are positioned and fixed. The penetrating direction of the through holes is the optical axis direction and is perpendicular to the movable direction of the movable part 114. Therefore, a force applied to the movable-side holding unit 300 when the movable-side holding unit 300 is assembled and fixed is a force in a direction perpendicular to the movable direction.

As a result, a force in the movable direction is not applied to the movable part 114, and hence when performing assembly and fixing, the movable part 114 is prevented from moving, which makes it possible to perform a stable fixing operation. Particularly, in a case where the heat dissipation members 200 are arranged on a plurality of different sides (the upper side and the right side of the fixed part 113 in FIG. 3B) as shown in FIGS. 3A and 3B, if the movable part 114 is moved during assembly and fixing, it is difficult to fix the plurality of heat dissipation members 200. For this reason, the configuration of the present embodiment in which the fixing direction is set to a direction perpendicular to the movable direction is effective for improvement of the assembly workability. That is, the assembly workability is improved by performing fixing of the movable-side holding plate 301 (first holding plate) and the fixed-side holding plate 311 (second holding plate) in the optical axis direction.

The fixed-side holding plate 311 and the fixed-side adhering member 312 are also each formed with at least three through holes for the same reason as the movable side. Note that FIGS. 5A and 5B each illustrate the three through holes. Further, in the present embodiment, the heat dissipation member 200 is fixed by fixing the movable-side fixing member 303 and the fixed-side fixing member 313 with the screw, and hence there is a merit that it is easy to perform disassembly and reassembly work.

Further, as illustrated in FIG. 5B, the movable-side holding unit 300 and the fixed-side holding unit 310 are required to have some distance therebetween. These holding units are required to be spaced away at least more than the longer one of distances A and B defined as follows: The distance A is "(distance between the movable-side contact portion 201 and the fixed-side contact portion 202 in the optical direction)+(height of the positioning shape formed on the movable part 114 or the fixed part 113)". The distance B is "$\{$(distance between the movable-side contact portion 201 and the fixed-side contact portion 202 in the optical direction)$^2$+(movable distance of the movable part 114)$^2\}^{0.5}$". By this configuration, it is possible to prevent the heat dissipation member 200 from being pulled more than necessary and broken. Note that from the point of view of the controllability of the image blur correction device, the distance is preferably further sufficiently longer. Further, as another aspect from the point of view of the controllability of the image blur correction device, the distance between the movable-side holding plate 301 and the fixed-side holding plate 311 can be made longer than the "distance between the fixed part 113 and the movable part 114+the movable distance of the movable part 114". Further, the length of the heat dissipation member 200 between the movable-side holding plate 301 (first holding plate) and the fixed-side holding plate 311 (second holding plate) can be made longer than the distance between the movable part 114 and the fixed part 113.

Figure 6A:
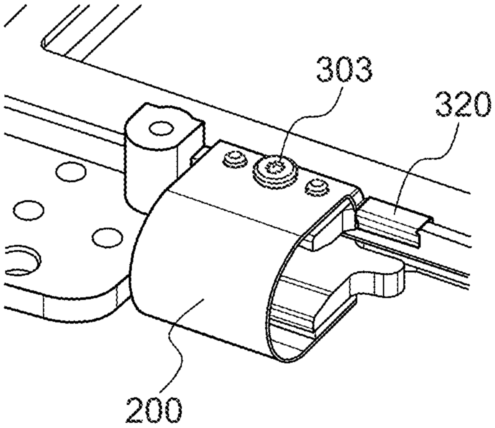
FIGS. 6A to 6C are a perspective view and cross-sectional views of a first variation.
Figure 6B:
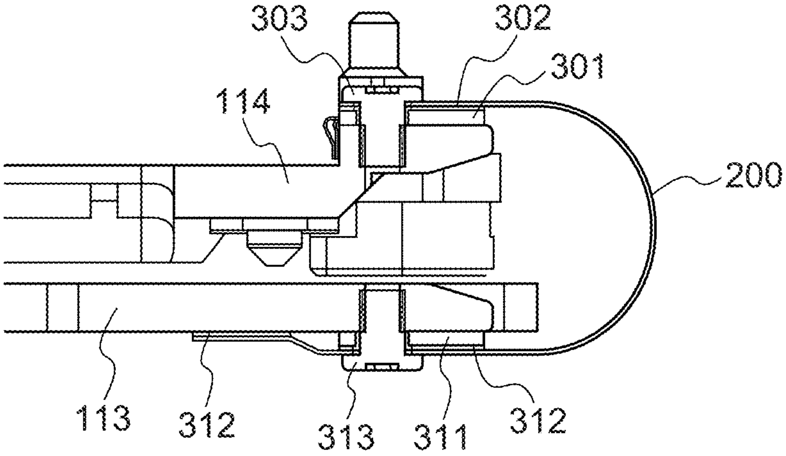
Figure 6C:
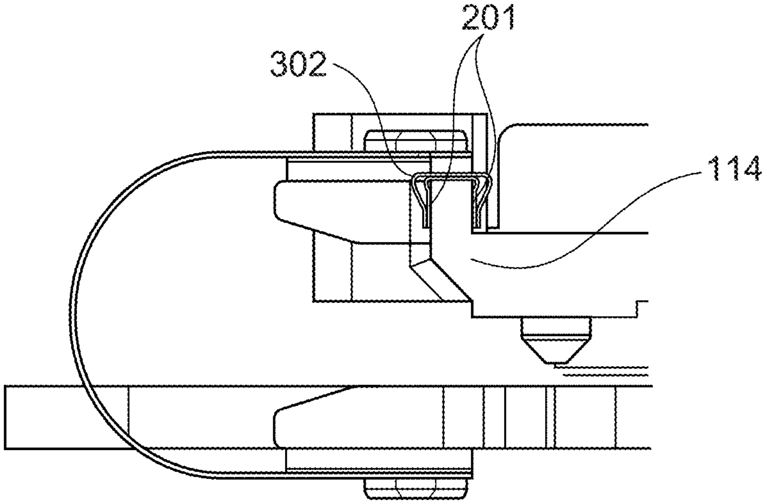

Next, a configuration using a holding member 320 for a contact portion between the movable part 114 and the heat dissipation member 200 will be described as a first variation of the present disclosure with reference to FIGS. 6A to 6C. FIG. 6A is a perspective view of the first variation, and FIGS. 6B and 6C are cross-sectional views of the first variation. In the first variation, the holding member 320 is further provided. As shown in FIG. 6A, the holding member 320 is disposed in the vicinity of the movable-side fixing member 303 provided such that the movable-side fixing member 303 covers part of the heat dissipation member 200. That is, the holding member 320 is provided in the vicinity of the movable-side fixing member 303 that fixes the heat dissipation member 200 and the movable part 114.

FIG. 6B is the cross-sectional view of the movable-side holding unit 300, the fixed-side holding unit 310, and so forth, in the first variation. As for the movable side, the heat dissipation member 200 is fixed to the movable part 114 by the movable-side fixing member 303 via the movable-side adhering member 302 and the movable-side holding plate 301.

As for the fixed side, similarly, the heat dissipation member 200 is fixed to the fixed part 113 by the fixed-side fixing member 313 via the fixed-side adhering members 312 and the fixed-side holding plate 311. As shown in FIG. 6B, a fixed-side end of the heat dissipation member 200 is fixed to the fixed part 113 by the fixed-side adhering members 312. Although the two fixed-side adhering members 312 are used in the illustrated example, one large adhering member can be used.

The configuration of the holding member 320 will be described with reference to FIG. 6C. The holding member 320 has a U-shape and is arranged such that the holding member 320 sandwiches part of the movable part 114 and the movable-side contact portion 201 (see e.g. FIGS. 4A and 4B) of the heat dissipation member 200, from opposite sides. With this, the heat dissipation member 200 and the movable part 114 are directly and thermally connected to each other. Therefore, it is possible to dissipate heat of the movable part 114 from the movable-side contact portion 201 to the heat dissipation member 200.

The holding member 320 is fitted to the movable part 114 while expanding the holding member 320 from the light receiving surface side (upper side in FIG. 6C) of the image sensor 115. Similar to the above-described movable-side fixing member 303, since the fixing direction is set to a direction perpendicular to the driving direction of the movable part 114, it is easy to assemble and fix the holding member 320. Note that although in the first variation, a sheet metal is used for the holding member 320, the holding member 320 is only required to be capable of holding the movable-side contact portion 201 and the movable part 114, and hence can be made of resin, rubber, or the like. Note that compared with the above-described embodiment, bending radius of the heat dissipation member 200 can be made larger in the first variation, and hence it is advantageous from the point of view of the controllability of image blur correction.

Figure 7A:
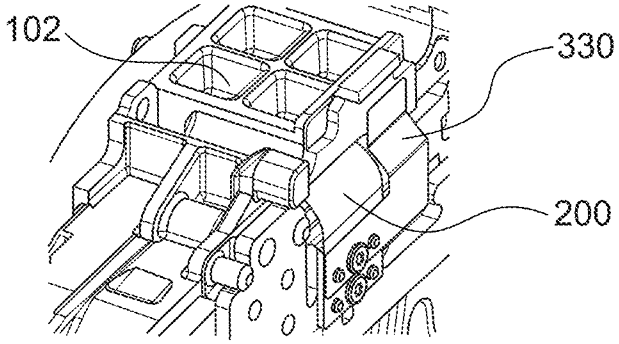
FIGS. 7A to 7C are a perspective view, a cross-sectional perspective view, and a cross-sectional view of a second variation, respectively.
Figure 7B:
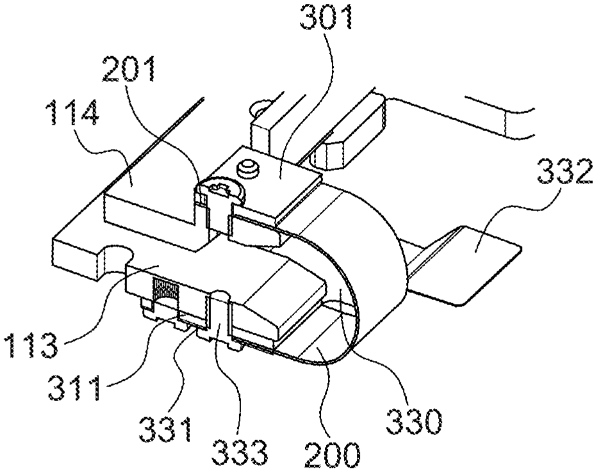
Figure 7C:
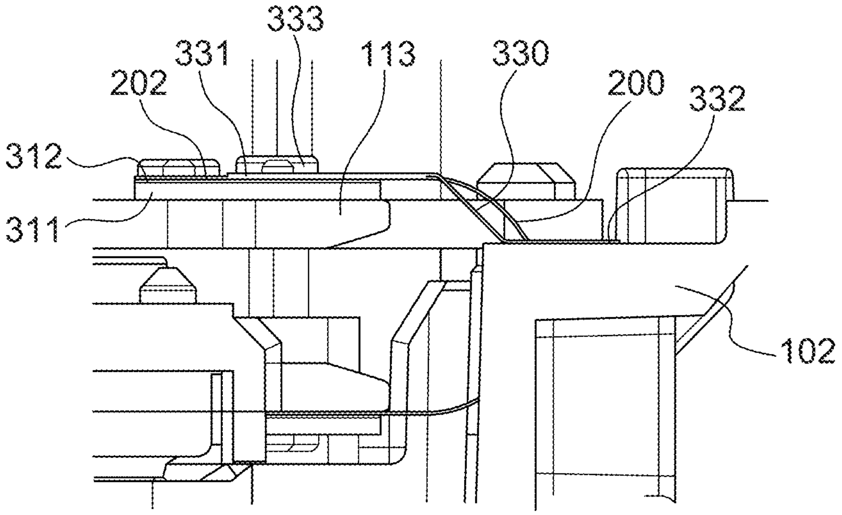

Next, a configuration further including a second heat dissipation member will be described with reference to FIGS. 7A to 7C. FIGS. 7A, 7B, and 7C are a perspective view, a cross-sectional perspective view, and a cross-sectional view of a second variation. In the second variation, the second heat dissipation member, denoted by reference numeral 330, is formed e.g. by a graphite sheet laminated e.g. by a PET film, and is arranged such that the second heat dissipation member 330 connects between the heat dissipation member 200 and the front base 102 as illustrated in FIG. 7A. The configuration of thermal connection between the movable part 114 and the heat dissipation member 200 in the second variation is the same as that shown in FIGS. 4A and 4B. As shown in FIG. 7B, the movable part 114 and the heat dissipation member 200 are brought into direct contact by the movable-side contact portion 201. However, similar to FIG. 6B, the movable-side holding plate 301 can be arranged between the movable part 114 and the heat dissipation member 200.

The second heat dissipation member 330 has a heat source-side connection portion 331 and a base-side connection portion 332. As shown in FIG. 7C, the heat source-side connection portion 331 overlaps the fixed-side contact portion 202, the fixed-side adhering member 312, the fixed-side holding plate 311, and the fixed part 113, in the mentioned order in the optical axis direction, and is fixed to the fixed part 113 by a heat source-side fixing member 333. By this configuration, the heat dissipation member 200 and the second heat dissipation member 330 are brought into direct contact with each other, and hence, it is possible to more efficiently dissipate heat from the image sensor 115 to the front base 102. The heat source-side connection portion 331 can be separately fixed by a holding plate, not shown, for the improvement of the assembly workability when the heat source-side connection portion 331 is fixed by the heat source-side fixing member 333.

FIG. 7C shows a state in which the base-side connection portion 332 is brought into contact with the front base 102. The base-side connection portion 332 is brought into contact with and fixed to the front base 102 by a fixing member, not shown. For example, the fixing member, not shown, is a screw, a double-sided tape, or the like.

Heat generated from the image sensor 115 in the second variation is transferred from the movable part 114 to the heat dissipation member 200, and is also directly transferred to the second heat dissipation member 330 without via the fixed part 113 as described above to be diffused to the front base 102. Therefore, it is possible to quickly transfer the heat from the image sensor 115 to the front base 102. As a result, it is possible to efficiently perform thermal diffusion within the camera 100. Further, from the point of view of the assembly workability, the base-side connection portion 332 is arranged in an area which does not overlap the movable part 114 in the optical axis direction.

Note that although in the second variation, the graphite sheet is used as the material of the second heat dissipation member 330, a sheet metal or the like can be used insofar as the sufficient heat dissipation performance can be ensured. In this case, by configuring the second heat dissipation member 330 such that the second heat dissipation member 330 is pressed against the front base 102, it is possible to eliminate the need of the fixing member, not shown, provided on the contact portion between the base-side connection portion 332 and the front base 102. Further, although the heat source-side fixing member 333 is a screw, in a case where sufficient heat dissipation to the front base 102 is ensured, a member, such as a double-sided tape, which fixes with an adhesive, can be used between the heat source-side connection portion 331 and the fixed-side holding plate 311.

As described above, the second heat dissipation member 330 that connects between the fixed part 113 and the front base 102 (base portion) disposed in the vicinity of the fixed part 113 is provided. Then, the front base 102 and the second heat dissipation member 330 are thermally connected in an area in which the movable part 114 and the front base 102 do not overlap each other in the optical axis direction. In addition to this, the fixed part 113, the heat dissipation member 200, and the second heat dissipation member 330 can be configured such that they are thermally connected in at least part of an area in which these components overlap each other in the optical axis direction.

Figure 8:
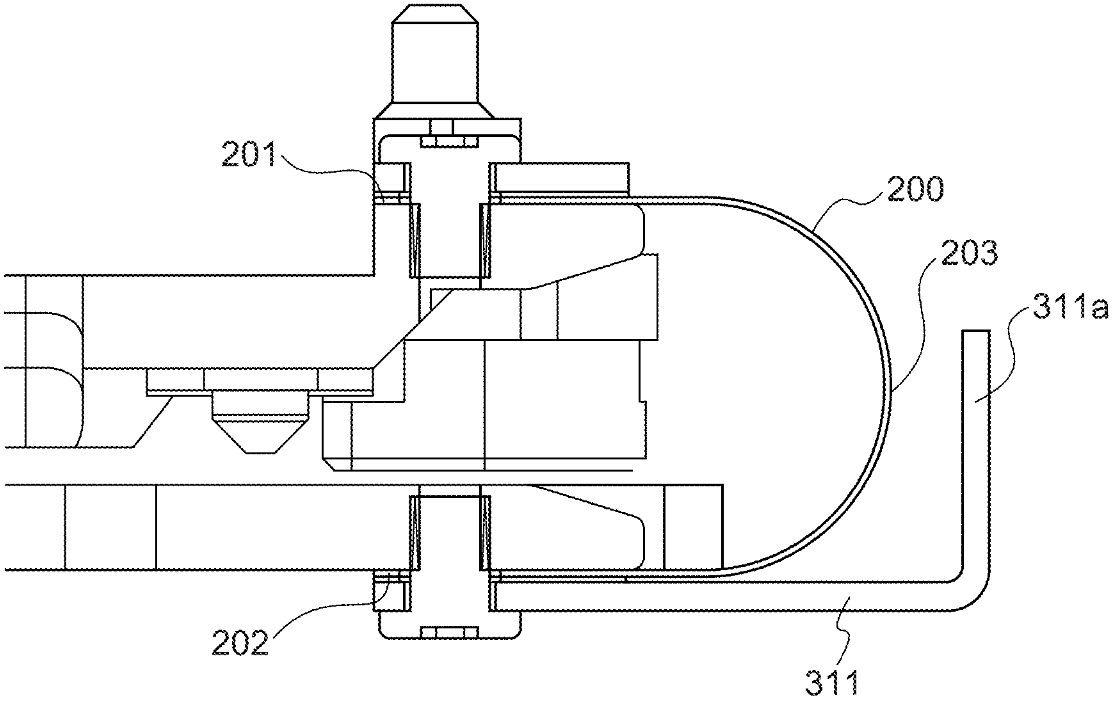
FIG. 8 is a cross-sectional view of a third variation.

Next, a case where the fixed-side holding plate 311 of a third variation has a bent extension 311*a* will be described with reference to FIG. 8. FIG. 8 is a cross-sectional view of the third variation. The fixed-side holding plate 311 has a bent portion where the fixed-side holding plate 311 is bent in the optical axis direction and has the bent extension 311*a* as a portion extending from the bent portion. The bent extension 311*a* is bent in a direction from the fixed part 113 toward the movable part 114. The height (in the vertical direction in FIG. 8) of the bent extension 311*a* is configured such that it is higher than a most protruding portion 203 which protrudes most in the heat dissipation member 200. In the third variation, the position of the height of the bent extension 311*a* is closer to the movable-side contact portion 201 than the midpoint between the movable-side contact portion 201 and the fixed-side contact portion 202.

That is, in the third variation, the fixed-side holding plate 311 (second holding plate) includes the bent extension 311*a* bent in the optical axis direction. Further, assuming that the width in the optical axis direction of the bent extension 311*a* is expressed as “height”, and the height of the bent extension 311*a* is higher than the most protruding portion which protrudes most in the heat dissipation member 200 formed into the U-shape.

Further, the bent extension 311*a* is always positioned outward of the most protruding portion 203 (right side in FIG. 8). In other words, a space between the most protruding portion 203 and the bent extension 311*a* in a case where the center of the image sensor 115 is positioned in the center of the optical axis is wider than half of the driving amount of the movable part 114. With this, it is possible to prevent contact between the heat dissipation member 200 and the bent extension 311*a* and prevent lowering of the controllability of the image blur correction mechanism. Further, for example, when the driving control to cause the movable part 114 to move is performed, even if the heat dissipation member 200 is moved to the right side in FIG. 8 due to some cause, the bent extension 311*a* functions as a stopper.

By providing the bent extension 311*a*, it is possible to prevent the heat dissipation member 200 from being unintentionally brought into contact with a peripheral component (such as the front base 102) to be thereby damaged e.g. when the heat dissipation member 200 is assembled or when the camera 100 is powered off.

The above-described embodiment and variations are described as the representative example of the present disclosure, and can be appropriately modified or changed when executing the present disclosure. For example, the configuration can be such that part of the heat dissipation member 200 is in direct contact with the movable part 114.

Other Embodiments

Embodiment(s) of the present disclosure can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present disclosure has been described with reference to exemplary embodiments, it is to be understood that the present disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2024-083269 filed May 22, 2024, which is hereby incorporated by reference herein in its entirety.

What is claimed is:

1. An image capturing apparatus including a movable part that holds an image sensor, and a fixed part that fixes the movable part in a state movable in a direction perpendicular to an optical axis direction, comprising:
- a heat dissipation member that connects between the movable part and the fixed part;
- a first holding plate that is held integrally with the heat dissipation member; and
- a second holding plate that is held integrally with the heat dissipation member and is different from the first holding plate,
- wherein the first holding plate is fixed to the movable part, and the second holding plate is fixed to the fixed part, and
- wherein fixing of the first holding plate and the second holding plate is performed in the optical axis direction.

2. The image capturing apparatus according to claim 1, further comprising:
- a movable-side fixing member that fixes the first holding plate and the movable part, and
- a fixed-side fixing member that fixes the second holding plate and the fixed part, and
- wherein the movable-side fixing member is mounted from a light receiving surface side of the image sensor, and the fixed-side fixing member is mounted from an opposite side from the light receiving surface side.

3. The image capturing apparatus according to claim 1, wherein a distance between the first holding plate and the second holding plate is longer than a length calculated by adding a movable distance of the movable part to a distance between the fixed part and the movable part.

4. The image capturing apparatus according to claim 1, wherein the material of the first holding plate and the second holding plate is a metal plate which has not been magnetized.

5. The image capturing apparatus according to claim 1, wherein a plurality of the heat dissipation members are mounted.

6. The image capturing apparatus according to claim 1, wherein part of the heat dissipation member is in direct contact with the movable part.

7. The image capturing apparatus according to claim 1, further comprising a second heat dissipation member that connects between the fixed part and a base portion arranged in the vicinity of the fixed part, and
- wherein the base portion and the second heat dissipation member are thermally connected to each other in an area in which the movable part and the base portion do not overlap each other in the optical axis direction.

8. The image capturing apparatus according to claim 7, wherein the fixed part, the heat dissipation member, and the second heat dissipation member are thermally connected to each other in at least part of an area in which the fixed part, the heat dissipation member, and the second heat dissipation member overlap each other in the optical axis direction.

9. The image capturing apparatus according to claim 1, further comprising a holding member arranged in the vicinity of the heat dissipation member and the movable-side fixing member that fixes the movable part.

10. The image capturing apparatus according to claim 1, further comprising a bent extension of the second holding plate, which is bent in the optical axis direction, and
- wherein assuming that a distance in the optical axis direction is defined as a height, the height of the bent portion is higher than a most protruding portion which is a portion protruding most in the heat dissipation member formed into a U-shape.

* * * * *